US008928417B2

(12) United States Patent
Canard

(10) Patent No.: US 8,928,417 B2
(45) Date of Patent: Jan. 6, 2015

(54) HIGH-LINEARITY PHASE FREQUENCY DETECTOR

(75) Inventor: David Canard, Demouville (FR)

(73) Assignee: Asahi Kasei Microdevices Corporation, Tokyo (JP)

( * ) Notice: Subject to any disclaimer, the term of this patent is extended or adjusted under 35 U.S.C. 154(b) by 151 days.

(21) Appl. No.: 13/465,556

(22) Filed: May 7, 2012

(65) Prior Publication Data
US 2013/0293315 A1    Nov. 7, 2013

(51) Int. Cl.
*H03L 7/00* (2006.01)
*H03L 7/085* (2006.01)
*H03L 7/089* (2006.01)

(52) U.S. Cl.
CPC ............ *H03L 7/085* (2013.01); *H03L 7/089* (2013.01); *H03L 7/0893* (2013.01); *H03L 7/0891* (2013.01)
USPC ............... 331/25; 331/1 A; 331/1 R; 331/11; 331/18; 327/236; 327/244

(58) Field of Classification Search
CPC ....... H03L 7/085; H03L 7/089; H03L 7/0891; H03L 7/0893
USPC ......... 327/236, 244; 331/1 A, 1 R, 11, 18, 25
See application file for complete search history.

(56) References Cited

U.S. PATENT DOCUMENTS

| 5,592,110 | A | 1/1997 | Noguchi |
| 6,111,470 | A * | 8/2000 | Dufour ........................ 331/17 |
| 6,693,494 | B2 * | 2/2004 | Fan ............................... 331/17 |
| 7,042,970 | B1 * | 5/2006 | Keaveney et al. ............ 375/371 |
| 2003/0076139 | A1 * | 4/2003 | Miyagawa et al. ........... 327/156 |
| 2009/0322432 | A1 * | 12/2009 | Liu et al. ........................ 331/25 |

FOREIGN PATENT DOCUMENTS

| GB | 2 335 322 A | 9/1999 |
| JP | 08-139595 A | 5/1996 |
| JP | 2002-507850 A | 3/2002 |

OTHER PUBLICATIONS

International Search Report and Written Opinion dated Jun. 4, 2013.

* cited by examiner

*Primary Examiner* — Arnold Kinkead
*Assistant Examiner* — Richard Tan
(74) *Attorney, Agent, or Firm* — Morgan, Lewis & Bockius LLP

(57) ABSTRACT

A phase frequency detector realizes a highly linear conversion from noise-shaped ΣΔ modulation into charge quantities without degradation of phase-locked loop (PLL) phase noise. The phase frequency detector may feature a construction of an Up signal output and a Down signal output, in which the Up signal rises when a divided VCO input rises, an Up signal falls when the divided VCO input falls, a Down signal rises when the divided VCO input rises, and a Down signal falls when a reference input rises. A mode selection input may be utilized for a fast lock-up PLL.

10 Claims, 9 Drawing Sheets

HIGH-LINEARITY PHASE FREQUENCY DETECTOR

FIELD OF INVENTION

The present invention relates generally to the field of phase-locked loops and, in particular, to the field of a fractional-N phase-locked loop frequency synthesizer.

BACKGROUND OF INVENTION

Current phase-locked loop (PLL) circuits may include features for comparing the phase of an output signal from a voltage-controlled oscillator (VCO) with the phase of an input reference frequency to the PLL. Such circuits may include a phase frequency detector for producing an error signal that signifies the proportion of any phase difference between the output signal and the input reference frequency. In addition, current PLL circuits may also include features for feeding the error signal into a low-pass filter and then into the VCO such that the output signal that is produced is synchronized with the input reference frequency to the PLL. Current PLL circuits may employ the negative feedback loop method of feeding the output from the VCO back into the input of the phase frequency detector such that an error signal may be generated, coupling the output signal from the VCO to the input reference frequency. In some current PLL circuits, the output signal may be fed into a frequency divider circuit to produce an integer multiple of the input reference frequency. When the phase-lock condition is reached, the output signal from the VCO is equal to N times the input reference frequency, where N is the division ratio of the frequency divider circuit. Accordingly, current PLL circuits generate frequencies only at integer multiples of the input reference frequency.

Those frequency synthesizers can only generate a frequency at an integer multiple of the input reference frequency. To circumvent such restriction, the frequency synthesizer may further include a ΣΔ modulator to modulate the value of the division per frequency cycle to obtain a fractional value. Such a frequency synthesizer is called a fractional-N frequency synthesizer. The fractional-N frequency synthesizer can generate signals whose frequency is of the form:

$$F_{vco} = F_{reference} \times \left( INT + \frac{FRAC}{MOD} \right),$$

where INT, FRAC, and MOD are integers, and $F_{VCO}$ is thus not necessarily an integer multiple of the reference frequency $F_{reference}$. Existing ΣΔ modulation may continuously create time differences at the input of the phase frequency detector, which in turn are converted into charge quantities by the charge-pump. The ΣΔ modulator shapes the fractional-N modulation power towards the high frequencies and, by doing so, shifts the degrading, extra noise outside the bandwidth of the loop filter of the feedback loop, causing the extra noise to be filtered out. The conversion from time differences at the phase frequency detector input into charge quantities in the loop filter may be performed in a highly linear manner such that the noise-shaping, spectral properties that result from using the ΣΔ modulator are not altered such that some noise is, as a consequence, introduced into the PLL loop. Preventing such noise from being introduced into the PLL loop maintains the phase-noise performance that results from using fractional-N modulation implemented with a frequency divider and ΣΔ modulator. In other words, in order to prevent degradation of phase-noise spectral properties, especially in a fractional-N PLL synthesizer, various types of ΣΔ modulator noise shaping techniques may be known for this purpose; however, a highly linear conversion method from a detected phase deference at a phase frequency detector into charge quantities on the loop filter, connected to VCO, is not known.

SUMMARY OF THE INVENTION

Accordingly, the present invention is directed to a system and method for implementing a fractional-N frequency synthesizer in a phase-locked loop circuit that substantially obviates one or more problems due to limitations and disadvantages of the related art by introducing a novel linearization system and method.

In an embodiment, the present invention provides a phase frequency detector circuit, applied for a phase-locked loop (PLL) circuit with a charge-pump, a voltage-controlled oscillator (VCO) for providing a VCO output signal, an N-divider having an input for receiving the VCO output, signal and for providing an N-divided output signal, a modulator for modulating the N-divided output signal, a reference frequency supply, and a loop filter, including a first input for receiving a signal oscillating at a reference frequency, a second input for receiving the N-divided output signal, an Up signal output, and a Down signal output. The VCO is in series with the charge-pump and loop filter followed by the N-divider, and the VCO is configured to receive a tuning voltage signal from the loop filter, and features a construction of an Up signal and Down signal. The Up signal rises when the second input rises and falls when the second input falls, and the Down signal rises when the second input rises and falls when the first input rises.

In yet another embodiment, the present invention provides a phase frequency detector circuit applied for a phase-locked loop circuit with a VCO which has a positive coefficient between a control voltage for the VCO and the frequency of the VCO output signal, equipped with an Up signal that drives an Up source in the charge-pump, and a Down signal that drives a Down source in the charge-pump. The construction of the Up signal and the Down signal may be implemented as described above.

In yet another embodiment, the present invention provides a phase frequency detector circuit applied for a phase-locked loop circuit with a VCO which has a negative coefficient between a control voltage for the VCO and the frequency of the VCO output signal, equipped with an Up signal that drives a Down source in the charge-pump, and a Down signal that drives an Up source in the charge-pump. The construction of the Up signal and the Down signal may be implemented as described above.

In yet another embodiment, the present invention provides a phase frequency detector circuit applied for a PLL circuit associated with two or more modes among which the PLL circuit varies from one to another along with time proceeding towards a locked-up state for the purpose of fast lock-up, and is equipped with a changeable construction of an Up signal and Down signal so that the described construction above is only realized when the PLL is close to or within the locked-up state and in the final mode. The construction of the Up signal and the Down signal is different when the PLL is not close to nor within the locked-up state and in previous modes.

In a further embodiment, the present invention provides a method implemented using a phase-locked loop circuit, the method comprising the steps of providing a VCO output signal by a voltage-controlled oscillator (VCO); receiving the VCO output signal by an N-divider, the N-divider providing an N-divided output signal; modulating the N-divided output signal; receiving a signal at a first input, the signal oscillating at a reference frequency; receiving the N-divided output signal at a second input; and comparing a phase of the first input and a phase of the second input at a phase frequency detector and charge-pump. The phase frequency detector and charge-pump may feature a specific linearization system with the construction of an Up signal and a Down signal in which the Up signal rises when the second input rises, the Up signal falls when the second input falls, the Down signal rises when the second input rises, and the Down signal falls when the first input rises. The VCO may be in series with a loop filter and the N-divider, and the VCO receives a tuning voltage signal from the loop filter.

In yet another embodiment, the present invention provides a method implemented using a phase-locked loop circuit associated with two or more modes, the method comprising the steps of providing a changeable construction of an Up signal and a Down signal so that the described construction above is only realized when the PLL is close enough to or within a locked-up state and in the final mode, and a construction of the Up signal and Down signal may be different when the PLL is not close to the locked-up and in the previous modes.

In a further embodiment, the present invention provides a phase frequency detector, including a first input for receiving a signal oscillating at a reference frequency, a second input for receiving an N-divided output signal, a first flip-flop for receiving the N-divided output signal at a first flip-flop trigger input, the first flip-flop comprising a reset input and a first flip-flop output, a second flip-flop for receiving the signal oscillating at a reference frequency at a second flip-flop trigger input, the second flip-flop comprising a reset input and a second flip-flop output, a NAND logic gate for receiving the first flip-flop output and the second flip-flop output, an AND logic gate for receiving the first flip-flop output and an output of the NAND logic gate, an inverter logic gate for receiving the output of the NAND logic gate, an output of the inverter logic gate being connected to the reset input of the first flip-flop and the reset input of the second flip-flop, wherein the second input for receiving the N-divided output signal comprises an Up signal output of the phase frequency detector, and output of the AND logic gate comprises a Down signal output of the phase frequency detector.

In a further embodiment, the present invention provides a phase frequency detector, including a first input for receiving a signal oscillating at a reference frequency, a second input for receiving an N-divided output signal, a first flip-flop for receiving the N-divided output signal at a first flip-flop trigger input, the first flip-flop comprising a reset input and a first flip-flop output, a second flip-flop for receiving the signal oscillating at a reference frequency at a second flip-flop trigger input, the second flip-flop comprising a reset input and a second flip-flop output, a NAND logic gate for receiving the first flip-flop output and the second flip-flop output, a first AND logic gate for receiving the second flip-flop output and a frequency mode enable signal, a second AND logic gate for receiving the first flip-flop output and an output of the NAND logic gate, an inverter logic gate for receiving the output of the NAND logic gate, an output of the inverter logic gate being connected to the reset input of the first flip-flop and the reset input of the second flip-flop, and an OR logic gate for receiving an output of the first AND logic gate and the N-divided output signal, wherein output of the OR logic gate includes an Up signal output of the phase frequency detector, output of the second AND logic gate comprises a Down signal output of the phase frequency detector. A frequency mode enable signal may be used for the two or multi-mode PLL.

In a further embodiment, the present invention provides a method implemented using a phase frequency detector, the method including the steps of receiving at a first input a signal oscillating at a reference frequency; receiving at a second input an N-divided output signal; receiving at a first flip-flop the N-divided output signal at a first flip-flop trigger input, the first flip-flop comprising a reset input and a first flip-flop output; receiving at a second flip-flop the signal oscillating at a reference frequency at a second flip-flop trigger input, the second flip-flop comprising a reset input and a second flip-flop output; receiving at a NAND logic gate the first flip-flop output and the second flip-flop output; receiving at an AND logic gate the first flip-flop output and an output of the NAND logic gate; receiving at an inverter logic gate the output of the NAND logic gate, an output of the inverter logic gate being connected to the reset input of the first flip-flop and the reset input of the second flip-flop, wherein the second input for receiving the N-divided output signal comprises an Up signal output of the phase frequency detector, and output of the second AND logic gate comprises a Down signal output of the phase frequency detector.

In a further embodiment, the present invention provides a method implemented using a phase frequency detector, the method comprising the steps of receiving at a first input a signal oscillating at a reference frequency; receiving at a second input an N-divided output signal; receiving at a first flip-flop the N-divided output signal at a first flip-flop trigger input, the first flip-flop including a reset input and a first flip-flop output; receiving at a second flip-flop the signal oscillating at a reference frequency at a second flip-flop trigger input, the second flip-flop including a reset input and a second flip-flop output; receiving at a NAND logic gate the first flip-flop output and the second flip-flop output; receiving at a first AND logic gate the second flip-flop output and a frequency mode enable signal; receiving at a second AND logic gate the first flip-flop output and an output of the NAND logic gate; receiving at an inverter logic gate the output of the NAND logic gate, an output of the inverter logic gate being connected to the reset input of the first flip-flop and the reset input of the second flip-flop; and receiving at an OR logic gate an output of the first AND logic gate and the N-divided output signal, wherein output of the OR logic gate comprises an Up signal output of the phase frequency detector, output of the second AND logic gate comprises a Down signal output of the phase frequency detector, and a frequency mode enable signal may be used for mode change in the dual or multi-mode PLL for fast lock-up.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention. In the drawings.

DETAILED DESCRIPTION

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present invention and the subject matter may be practiced without these specific details. For example, it will be apparent to one of ordinary skill in the art that the subject matter presented herein can be implemented on any type of phase-locked loop circuit (PLL).

Figure 1:
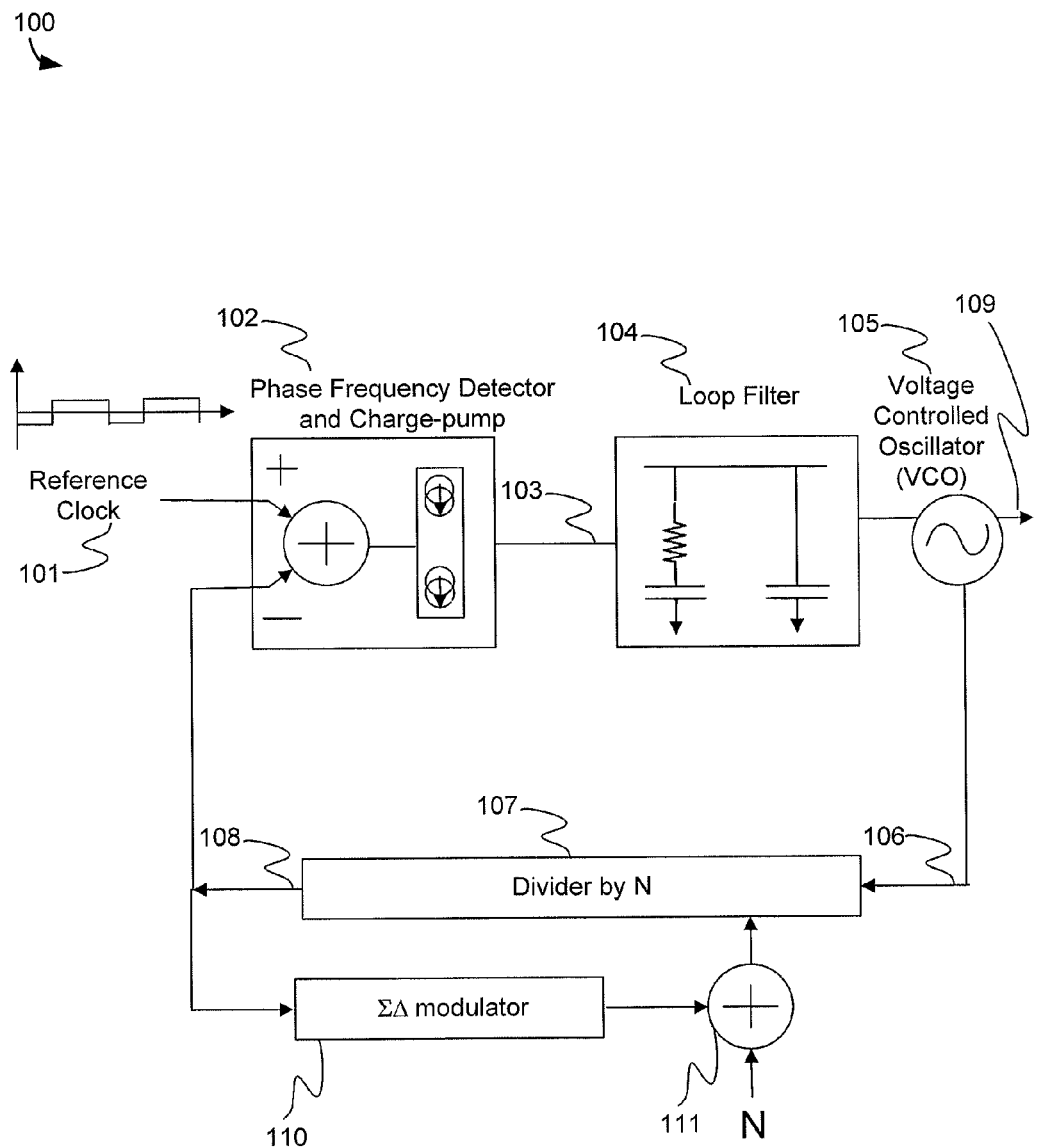
FIG. 1 illustrates an exemplary embodiment of a phase-locked loop (PLL) circuit with a fractional-N frequency synthesizer.

FIG. 1 illustrates an exemplary embodiment 100 of a phase-locked loop (PLL) circuit with a fractional-N frequency synthesizer. In the exemplary embodiment 100, a reference clock signal 101 may be an input to the phase frequency detector and charge-pump 102 along with the output signal 108 from an N-divider 107. The phase frequency detector and charge-pump 102 may detect the phase difference between the reference clock signal 101 and the output signal 108. The output signal 103 from the phase frequency detector and charge-pump 102 may be equal to current pulses proportional to the input phase difference and that may be integrated in the loop filter 104 to generate the tuning voltage required to obtain a given frequency on a voltage controlled oscillator (VCO) 105. The loop filter 104 is generally a passive circuit that may include a standard integrator and pole zero and a post filter. The post filter may be of a resistor-inductor-capacitor (RLC), resistor-capacitor (RC), or inductor-capacitor (LC). The loop filter 104 may improve the spectral purity of the VCO output signal 109 by filtering the charge-pump 102 current pulses. A first output signal 109 from the VCO 105 may be used as the input, for example, to a device connected to the VCO 105 for receiving a specific signal oscillating at a frequency controlled by the tuning voltage input to the VCO 105. A second output signal 106 from the VCO 105 may be used to create a negative feedback loop circuit through the N-divider 107 for use as an input to the phase frequency detector and charge-pump 102. The N-divider 107 may divide the second output signal 106 by N times, where N is a division ratio corresponding to N times the frequency of the reference clock signal 101. The output signal 108 from the N-divider 107 may be used as the clock input to a ΣΔ modulator 110. The output of the ΣΔ modulator 110 may be input to an adder 111 for adding the output of the ΣΔ modulator 110 to the value of N. The output of the adder 111 may be input to the N-divider 107. Use of the foregoing exemplary embodiment may result in modulating the value of a division cycle associated with the frequency divider circuit (comprising N-divider 107, ΣΔ modulator 110, and adder 111) such that a fractional number may be obtained, implementing fractional-N modulation. The modulation signals, at non-DC frequencies and using fractional-N modulation, may not exhibit power that may degrade the phase-noise performance of the frequency synthesizer. Specifically, the ΣΔ modulator 110 may shape such power to higher frequencies and, by doing so, shift the degrading, extra noise outside the bandwidth of the loop filter 104 of the feedback loop, causing the extra noise to be filtered out. Time differences may be generated using the ΣΔ modulator 110 and converted into charge quantities by a phase frequency detector and associated charge-pump 102. The conversion may be performed in a highly linear manner such that the noise-shaping, spectral properties that result from using the ΣΔ modulator 110 are not altered such that some noise is, as a consequence, introduced into the PLL loop. Preventing such noise from being introduced into the PLL loop maintains the phase-noise performance that results from using fractional-N modulation implemented with the N-divider 107 and ΣΔ modulator 110.

The use of the N-divider 107, ΣΔ modulator 110, and adder 111 as a fractional-N frequency synthesizer may result in the generation of signals whose frequency is of the following form:

$$F_{VCO}=F_{Reference} \times (INT+FRAC/MOD)$$

In the above equation, $F_{VCO}$ may not necessarily be an integer multiple of the reference clock signal 101, denoted by the variable $F_{Reference}$. The variables denoted by INT, FRAC, and MOD may be integers.

It is noted here that, in order to prevent the phase-noise spectral properties degradation in fractional-N PLL synthesizers, besides ΣΔ modulator noise shaping techniques, of which various types may be well known for this purpose, a highly linear conversion method from detected phase deference at a phase frequency detector into charge quantities on the loop filter connected to VCO is very important.

Figure 2:
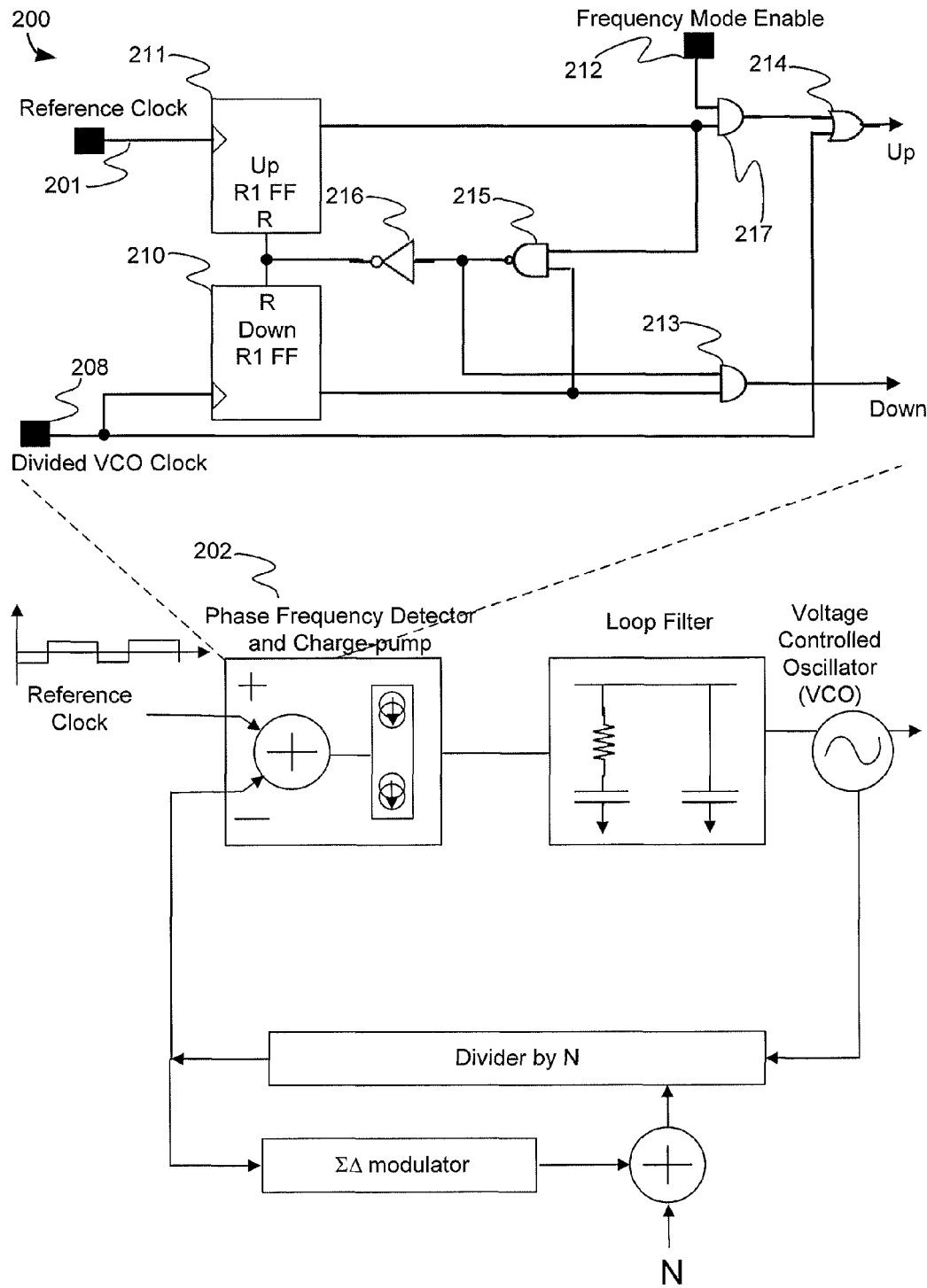
FIG. 2 illustrates an exemplary embodiment of a presently invented phase frequency detector applied to a PLL circuit in series with a fractional-N sigma delta (ΣΔ) modulator (only the phase frequency detector is shown in detail)

FIG. 2 illustrates an exemplary embodiment 200 of a phase frequency detector 202 of a PLL circuit in series with a fractional-N modulator. In exemplary embodiment 200, the individual elements of the phase frequency detector 202 are shown (individual charge-pump elements not shown). In particular, the phase frequency detector 202 includes a reference clock signal 201 input and a divided VCO clock signal 208 input. The divided VCO clock signal 208 input may be the output of the fractional-N frequency synthesizer. The divided VCO clock signal 208 input may be connected to the trigger input of a first flip-flop 210 (i.e., Down R1 flip-flop (FF)). The divided VCO clock signal 208 input may also be connected to the input of an OR logic gate 214. The first flip-flop 210 may include a reset down input and a first flip-flop 210 output. The reference clock signal 201 input may be connected to the trigger input of a second flip-flop 211 (i.e., Up R1 FF). The second flip-flop 211 may include a reset up input and a second flip-flop output. The first flip-flop 210 reset down input and the second flip-flop 211 reset up input may be connected to the output of an inverter logic gate 216. The input of the inverter logic gate may be the output of a NAND logic gate 215. The input of the NAND logic gate 215 may be the first flip-flop 210 output and the second flip-flop 211 output. A first AND logic gate 217 may receive as input the second flip-flop 211 output and a frequency mode enable signal 212. The output of the NAND logic gate 215 may also be connected to the input of a second AND logic gate 213. The second AND logic gate 213 may also receive the output of the first flip-flop 210. The OR logic gate 214 may also receive as input the output of the first AND logic gate 217.

The phase frequency detector 202 may operate in two modes using the exemplary configuration described above. The two modes may be called phase mode and frequency mode. In some embodiments, when the value of the frequency mode enable signal 212 is low, i.e., "0", then the phase mode may be enabled. In some embodiments, when the value of the frequency mode enable signal 212 is high, i.e., "1", then the frequency mode may be enabled. During phase mode, the output of the first AND logic gate 217 must always be low because it receives the frequency mode enable signal 212 as one of its inputs. As shown in FIG. 2, the output of the OR logic gate 214 (shown as "Up") will, in phase mode, always be the divided VCO clock signal 208, as the OR logic gate 214 will always receive a low, i.e., "0" output from the first AND logic gate 217, rendering it transparent. In some embodiments, the high, i.e., "1", state of the divided VCO clock signal 208 may be proportional to the period of the VCO. This is made possible because the N-divider 107 may be, according to its implementation, a counter of VCO cycles. Accordingly, in some embodiments, the "Up" signal (output of the OR logic gate 214) that may be connected to an Up source of the charge-pump (which may be also referred to as a "Source" of the charge-pump) may be turned on for some a (i.e., constant number) VCO period(s) at each cycle. The "Down" signal, in some embodiments, may be connected to a Down source of the charge-pump (which may be also referred to as a "Sink" of the charge-pump) and controlled by the phase frequency detector 202 such that in average it may cancel the "Up" signal. The second AND logic gate 213 may anticipate the reset of the first flip-flop 210 such that the reset delay of the down path does not depend on the state of the divided VCO clock signal 208. The reset timings of the first flip-flop 212 may, in some embodiments, depend on the state of the VCO clock signal 208.

In some embodiments a coefficient of VCO between input voltage and output frequency is assumed to be positive (i.e. output frequency increases along with input voltage increase). In case the VCO has a negative coefficient (i.e., the output frequency decreases along with an input voltage increase), the exemplary embodiment is also applicable by changing the connection(s) between phase frequency detector output pair and charge-pump source pair. The Up signal may be connected to a Down source (or "Sink") of the charge-pump, and the Down signal may be connected to an Up source (or "Source") of the charge-pump. The assumption that a coefficient of VCO is positive may be made for other embodiments as described, unless otherwise noted.

Figure 3:
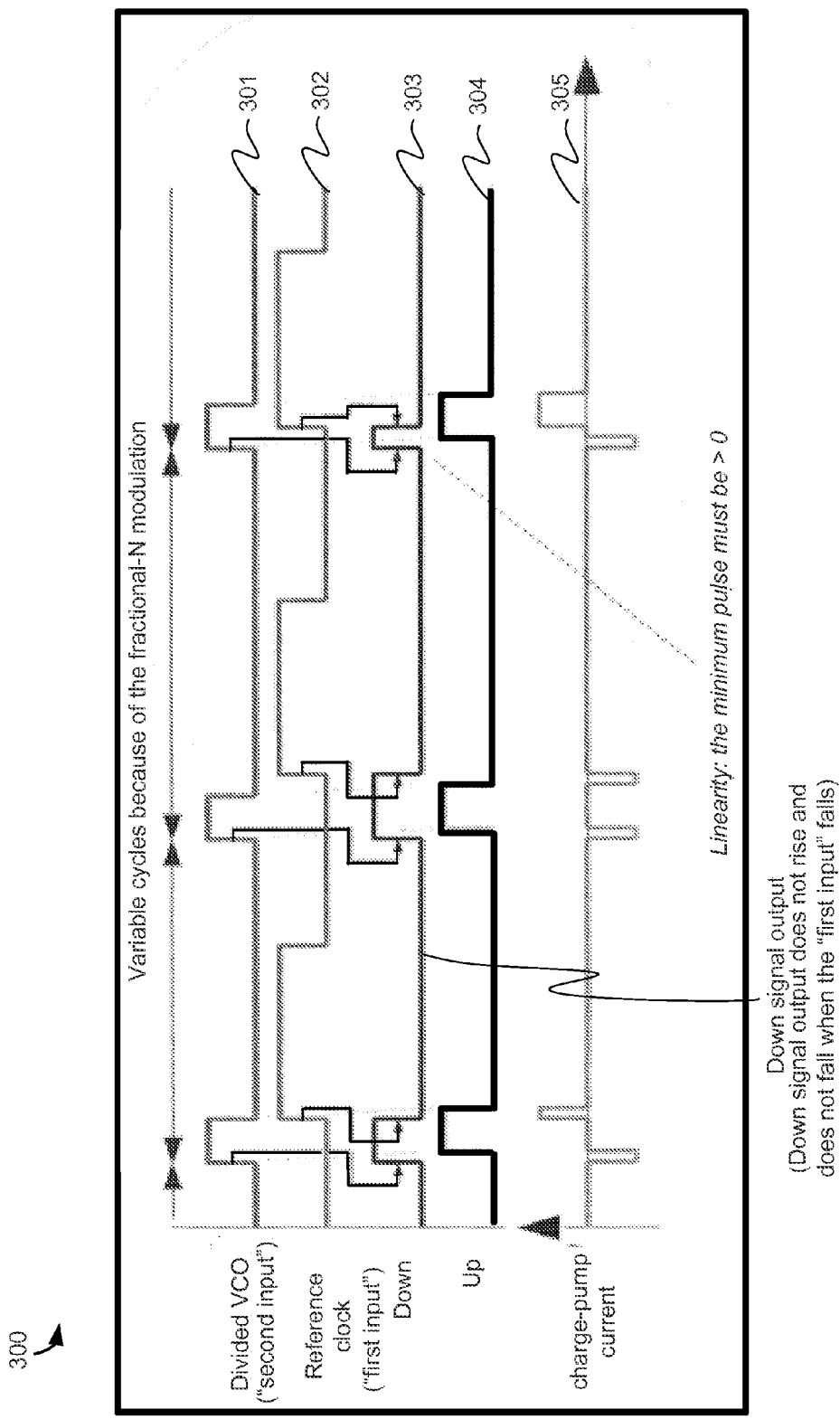
FIG. 3 illustrates an exemplary illustration of a signal diagram associated with fractional-N modulation, with phase frequency detector "Down" and "Up" outputs in accordance with present invention (when in phase mode)

FIG. 3 illustrates an exemplary illustration 300 of a signal diagram associated with fractional-N modulation, with phase frequency detector "Down" and "Up" outputs. In exemplary illustration 300, shown are the relationships between a divided VCO signal 301, a reference clock signal 302, a phase frequency detector "Down" signal 303, a phase frequency detector "Up" signal 304, and a charge-pump current 305. As shown in the exemplary illustration 300, the "Up" signal (source) 304 may supply a constant charge quantity at each cycle (a constant pulse, in some embodiments), while the "Down" signal (source) may be modulated by a ΣΔ modulator sequence. As a result, a high linearity at the charge-pump (output) may be achieved despite a mismatch between the charge-pump "Up" and "Down" signals (sources). That is, the "Down" source, in some embodiments, may be controlled by the phase frequency detector 202 such that on average it may cancel the "Up" source. Moreover, the duration of the pulse on the "Up" signal may be linked to the divided VCO signal 301 such that it may compensate for any time variation due to fractional-N modulation. On average, the "Up" and "Down" sources may be in their high states simultaneously, thus reducing breakthrough of the reference clock signal 302. Any static phase error associated with this exemplary embodiment may be created by the duration of the high-state of the divided VCO signal 301 and may not depend on the charge-pump current 305. In PLL embodiments where the charge-pump setting(s) is switched dynamically, the static phase error of such an embodiment may remain unchanged, maintaining a phase-locked state.

In some embodiments, a maximum current for the "Up" source (e.g., "Up" source 304) may be limited to a nominal charge-pump current (e.g., charge-pump current 305) multiplied by a duty cycle of the divided VCO signal 301. Although such an implementation may be restrictive, it may be possible to switch to the frequency mode (described above). In frequency mode, the "Up" source may be controlled by the second flip-flop 211 and the divided VCO clock signal 208 (as shown in the exemplary embodiment of FIG. 2). The range of the phase frequency detector (e.g., phase frequency detector 202) in frequency mode may be extended, for example, to a standard three-state phase-frequency-detector value and may be symmetrical. In some embodiments, non-linear responses may make such an implementation unsuitable for a phase-lock state. Such an embodiment may be suitable for fast-locking PLLs with simultaneous low-noise requirements. The initial stage of the locking process may be performed in frequency mode to ensure an optimum frequency and a coarse phase re-acquisition. Subsequently, the phase frequency detector 202 may be switched to phase mode (as described above) to reach a steady, phase-locked state. Because the static phase errors between frequency mode and phase mode may be identical, switching between the two modes may not generate a strong phase disturbance.

Figure 4:
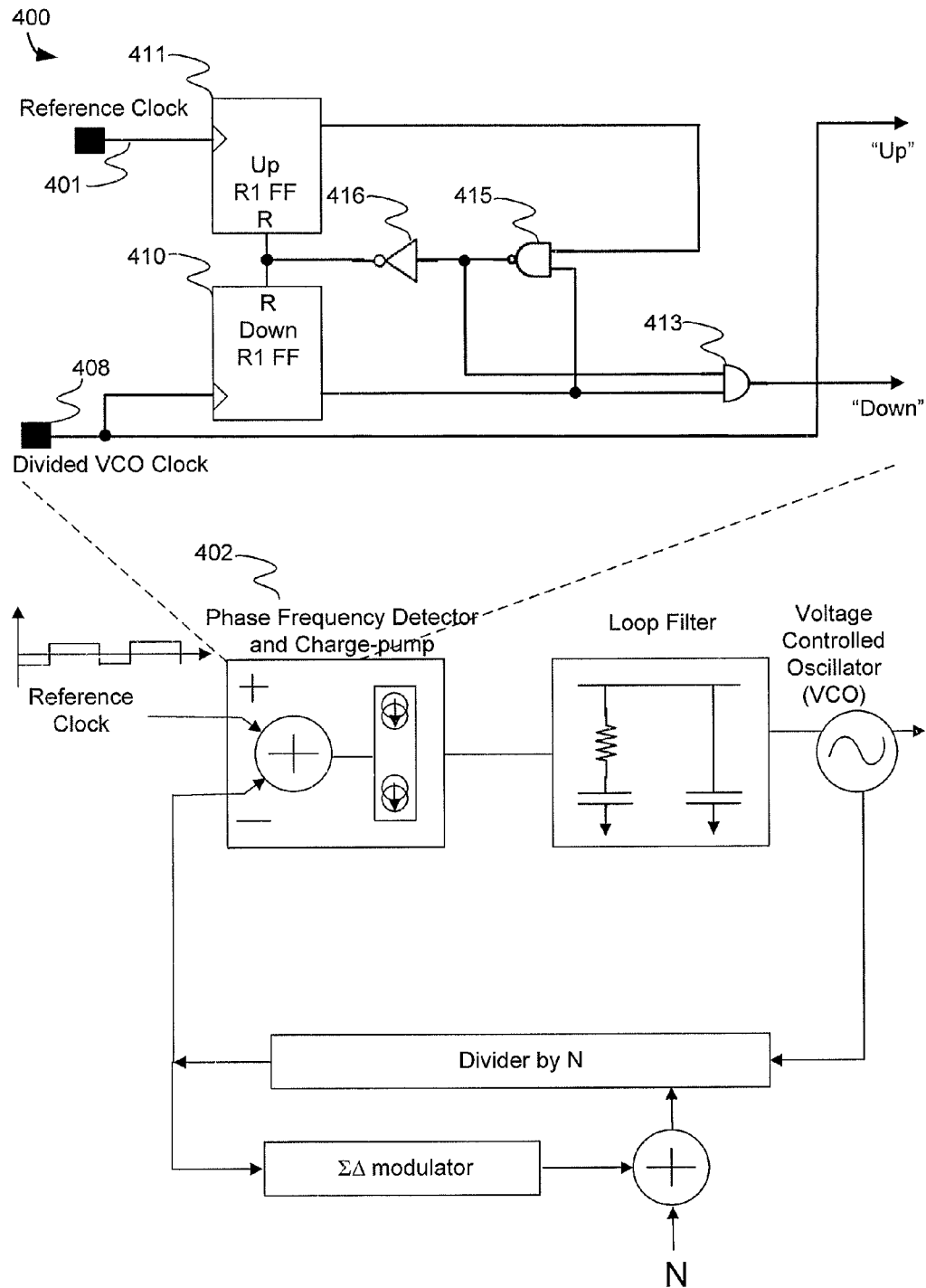
FIG. 4 illustrates an exemplary embodiment of an equivalent description for the presently invented phase frequency detector shown in FIG. 2, where the "frequency mode enable" shown in FIG. 2 is always low (i.e., "0"), as well as an exemplary embodiment of a phase frequency detector for a "single mode" PLL (only the phase frequency detector is shown in detail)

FIG. 4 illustrates an exemplary embodiment of a phase frequency detector and charge-pump of a PLL circuit in series with a fractional-N modulator (as shown in FIG. 2) with the frequency mode signal always low, i.e."0", and also an exemplary embodiment of a phase frequency detector for a "single mode" PLL. According to the logic circuit analysis already described for FIG. 2, when the frequency mode enable signal 212 stays low, the logic circuit in FIG. 2 can be translated into the simpler circuit shown at the top of FIG. 4. Because the fast-lock requirement does not always exist for a PLL application, the illustrated phase frequency detector circuit may be applicable for such a PLL without changing modes, i.e., for a single mode PLL. A benefit of this embodiment of a phase frequency detector is to provide a highly-linear conversion from the well noise-shaped ΣΔ modulator into charge quantities, without degradations on the loop filter connected to the VCO as a result of the charge-pump output.

Figure 5:
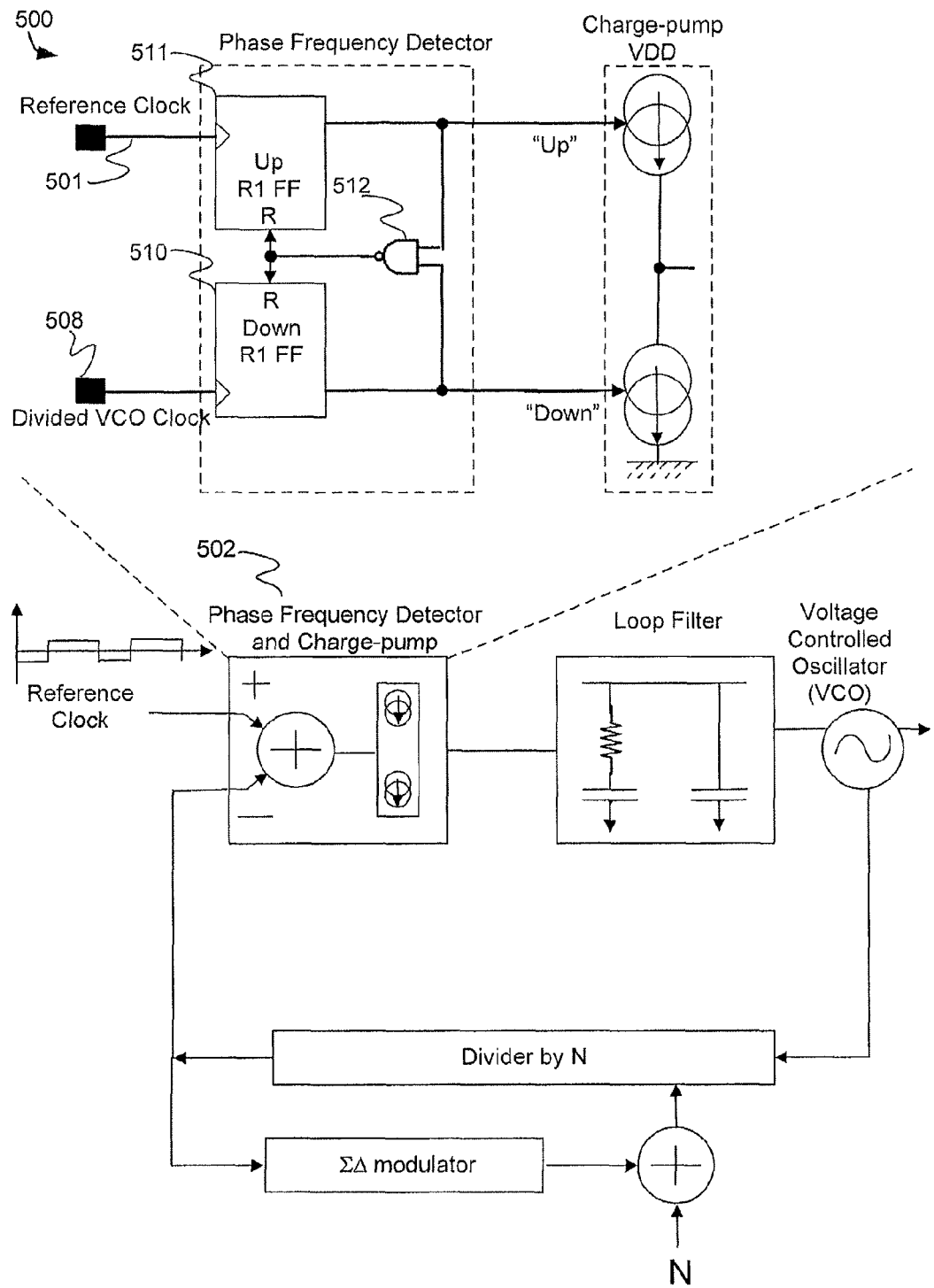
FIG. 5 illustrates an exemplary embodiment of a conventional phase frequency detector and charge-pump of a PLL circuit in series with a fractional-N sigma delta (ΣΔ) modulator (both the phase frequency detector and charge-pump are shown in detail)

FIG. 5 illustrates an exemplary embodiment 500 of a phase frequency detector and charge-pump 502 of a PLL circuit in series with a fractional-N modulator. The exemplary embodiment 500 includes a frequency detector and charge-pump 502 with symmetrical "Up" and "Down" signals between the phase frequency detector and charge-pump. Through the configuration, as shown, of the reference clock 501, divided VCO clock 508, first flip-flop 510, second flip-flop 511, and NAND logic gate 512, the "Up" signal rises when reference clock 501 rises, the "Up" signal falls when the divided VCO clock 508 rises, the "Down" signal rises when divided VCO clock 508 rises, and the "Down" signal falls when the reference clock 501 rises. With fractional-N modulation in a fractional-N PLL frequency synthesizer, where the divided VCO clock 508 is modulated by a ΣΔ modulator, both the pulse width of the "Up" signal and the pulse width of the "Down" signal are modulated by the modulator. The co-modulation of Up and Down signals causes somewhat non-linear properties in some embodiments, as shown in and described for FIG. 3. Although such an embodiment has symmetrical a construction of Up and Down signals (sources), it becomes difficult to realize in real circuits the finely symmetrical properties between Up and Down paths. An exemplary explanation of the non-linearity is that the conventional construction of a charge-pump in which Up source ("Source") is constructed by PMOS, besides a Down source ("Sink") constructed by NMOS, and that the process for matching between PMOS and NMOS is not usually perfect infinitely.

Figure 6:
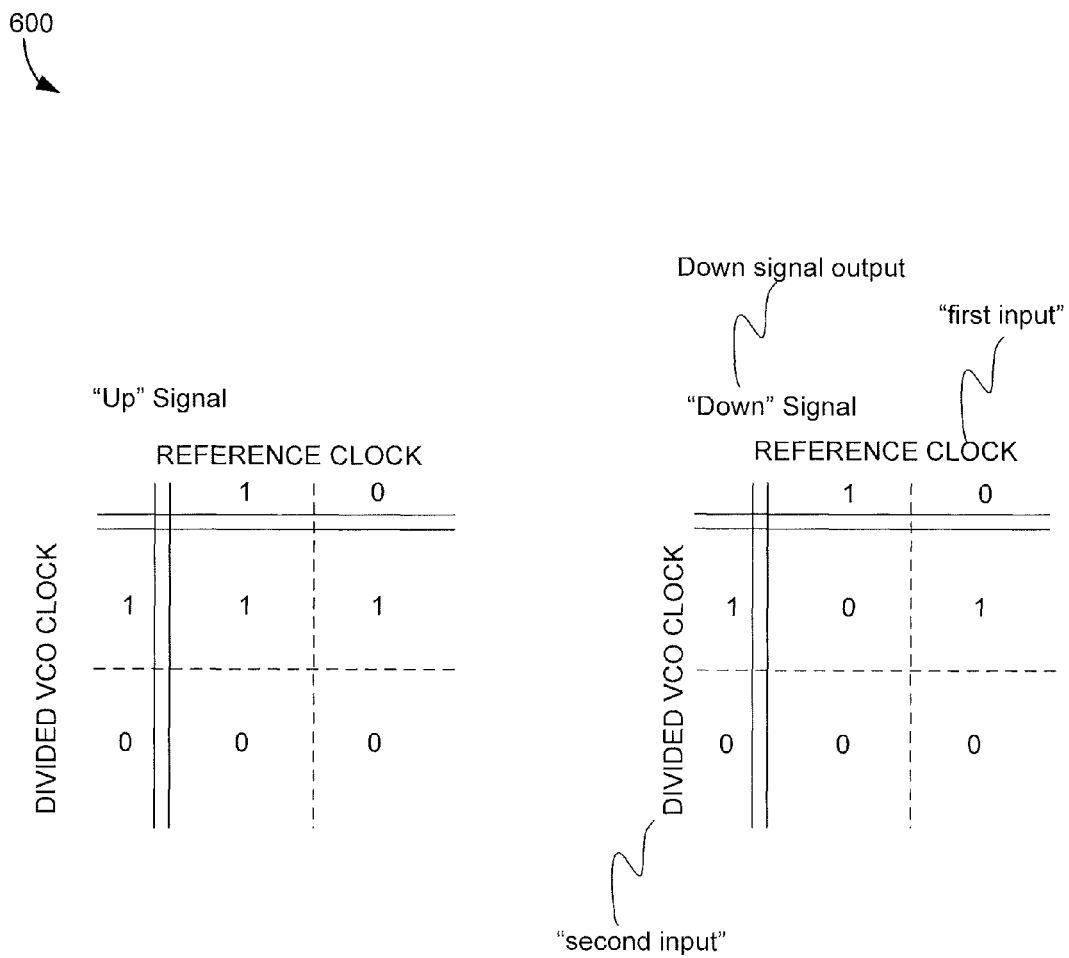
FIG. 6 illustrates Up signal and Down signal values of a presently invented phase frequency detector in relation to the reference clock and divided VCO clock supplied to the phase frequency detector.

FIG. 6 illustrates Up signal and Down signal values in relation to the reference clock and divided VCO clock supplied to the phase frequency detector (as shown in FIGS. 2 and 4). The "1" (high level) and "0" (low level) charts in FIG. 6 may be analyzed in conjunction with the logic circuit shown in FIG. 2 in low frequency mode, and by the logic circuit shown in FIG. 4. In some embodiment, and as shown in FIG. 6, the Up signal rises when the divided VCO clock rises, the Up signal falls when divided VCO signal falls, the Down signal rises when the divided VCO clock rises, and the Down signal falls when the reference clock rises. This construction of Up and Down signals, as compared to the embodiment shown in FIG. 5, features a linearity advantage useful for a fractional-N PLL. A reason underlying the advantage is that the pulse width of the Down signal is affected by a ΣΔ modulator, while the pulse width of the Up signal is constant relative to the divided VCO clock even if its cycle sequence is modulated by a ΣΔ modulator, as illustrated in and described for FIG. 3. In some embodiments, the Down path is "modulated" by a ΣΔ modulator and the PLL is free from non-linearity problems caused by realistic asymmetrical properties between the Up path and the Down path located between the phase frequency detector and charge-pump.

Figure 7:
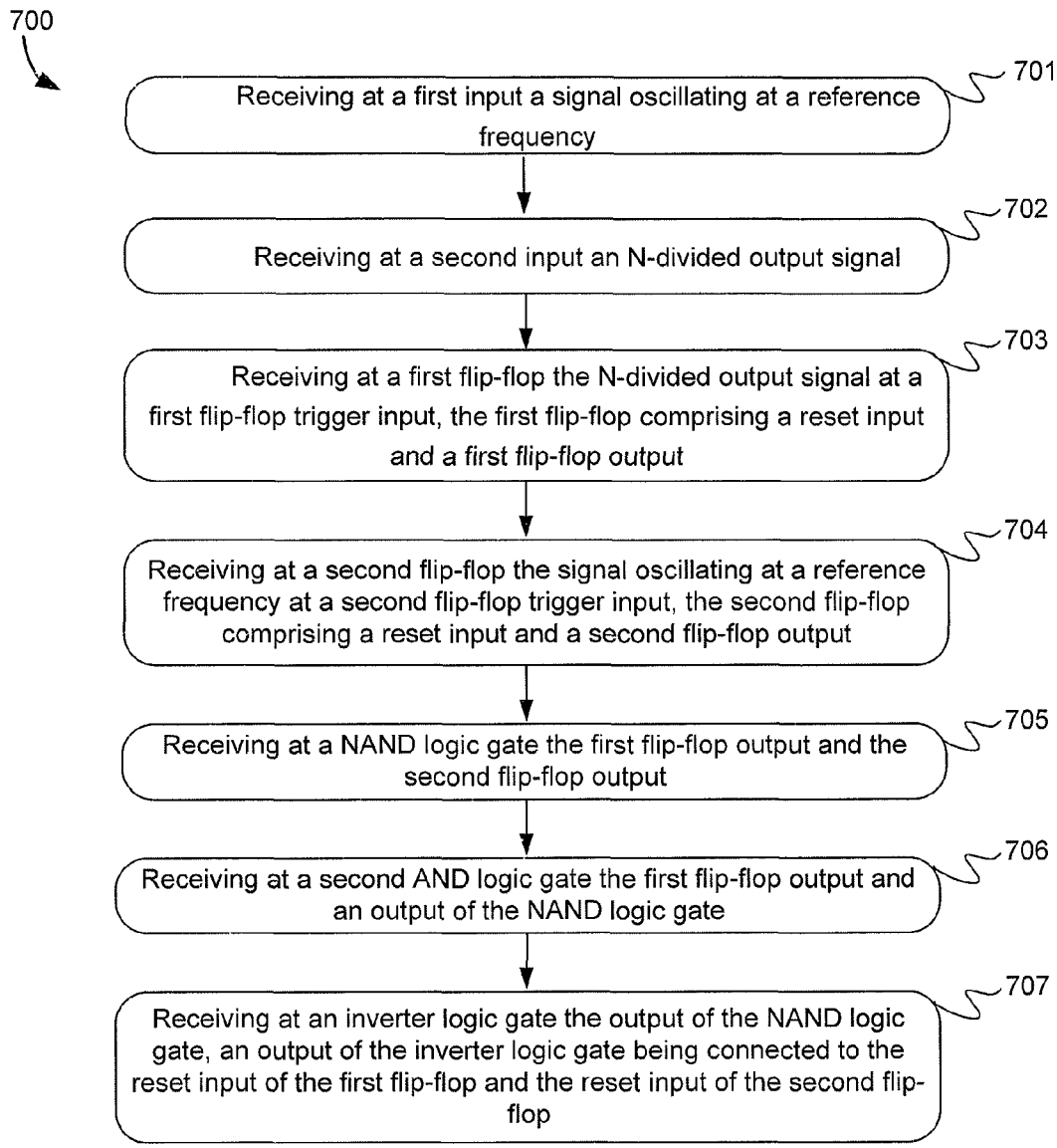
FIG. 7 illustrates exemplary method steps for a presently invented phase frequency detector (for a single-mode PLL)

FIG. 7 illustrates exemplary method steps 700 for a phase frequency detector (for a single-mode PLL). The phase frequency method steps 700 are for receiving at a first input a signal oscillating at a reference frequency 701, receiving at a second input an N-divided output signal 702, receiving at a first flip-flop the N-divided output signal at a first flip-flop trigger input, the first flip-flop comprising a reset input and a first flip-flop output 703, receiving at a second flip-flop the signal oscillating at a reference frequency at a second flip-flop trigger input, the second flip-flop comprising a reset input and a second flip-flop output 704, receiving at a NAND logic gate the first flip-flop output and the second flip-flop output 705, receiving at a second AND logic gate the first flip-flop output and an output of the NAND logic gate 706, and receiving at an inverter logic gate the output of the NAND logic gate 707, an output of the inverter logic gate being connected to the reset input of the first flip-flop and the reset input of the second flip-flop.

Figure 8:
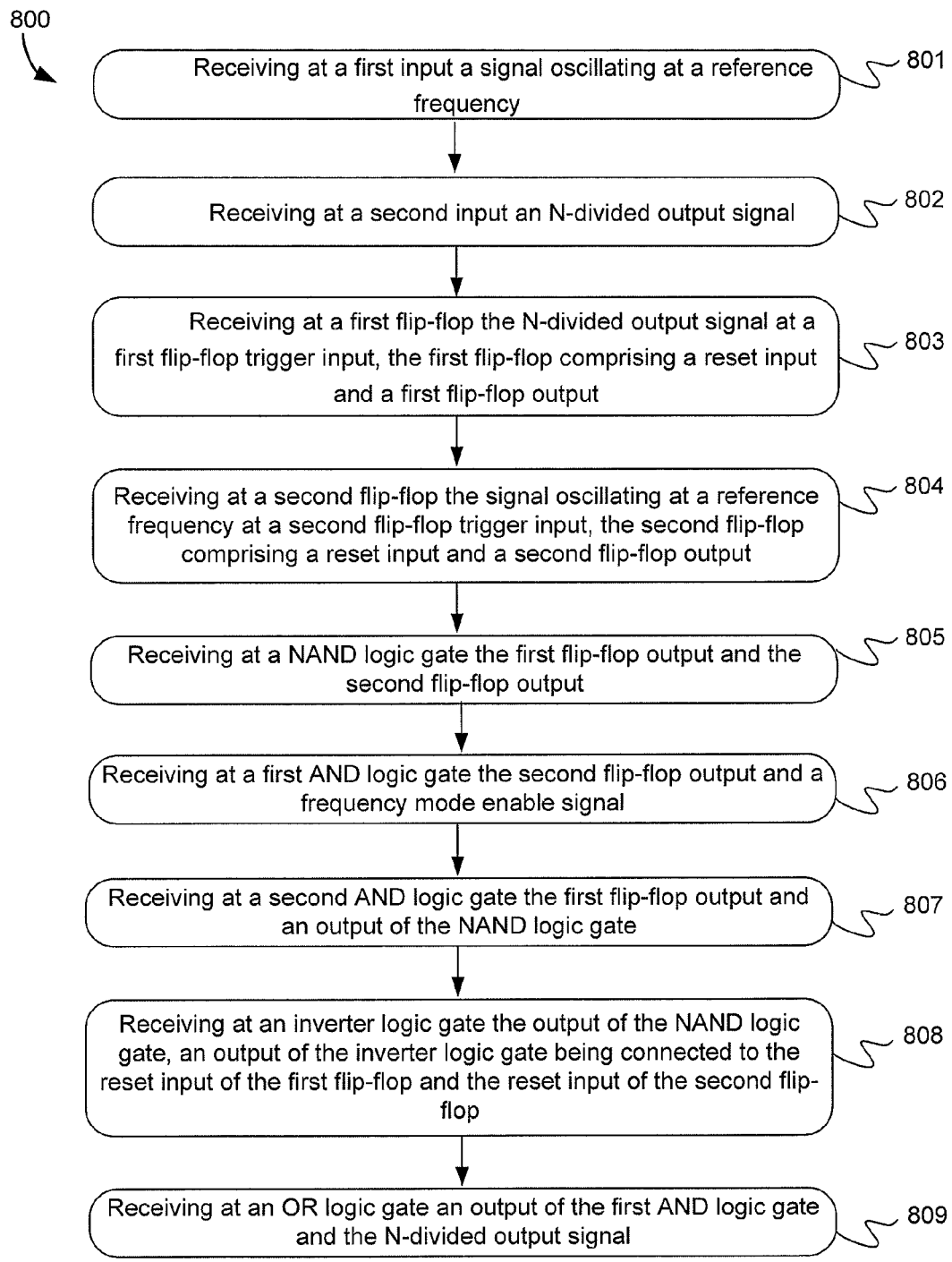
FIG. 8 illustrates exemplary method steps for a presently invented phase frequency detector (for a dual or multi-mode PLL)

FIG. 8 illustrates exemplary method steps 800 for a phase frequency detector (for a dual or multi-mode PLL). The phase frequency detector method steps 800 are for receiving at a first input a signal oscillating at a reference frequency 801, receiving at a second input an N-divided output signal 802, receiving at a first flip-flop the N-divided output signal at a first flip-flop trigger input, the first flip-flop comprising a reset down input and a first flip-flop output 803, receiving at a second flip-flop the signal oscillating at a reference frequency at a second flip-flop trigger input, the second flip-flop comprising a reset input and a second flip-flop output 804, receiving at a NAND logic gate the first flip-flop output and the second flip-flop output 805, receiving at a first AND logic gate the second flip-flop output and a frequency mode enable signal 806, receiving at a second AND logic gate the first flip-flop output and an output of the NAND logic gate 807, receiving at an inverter logic gate the output of the NAND logic gate 808, an output of the inverter logic gate being connected to the reset input of the first flip-flop and the reset input of the second flip-flop, and receiving at an OR logic gate an output of the first AND logic gate and the N-divided output signal 809.

Figure 9:
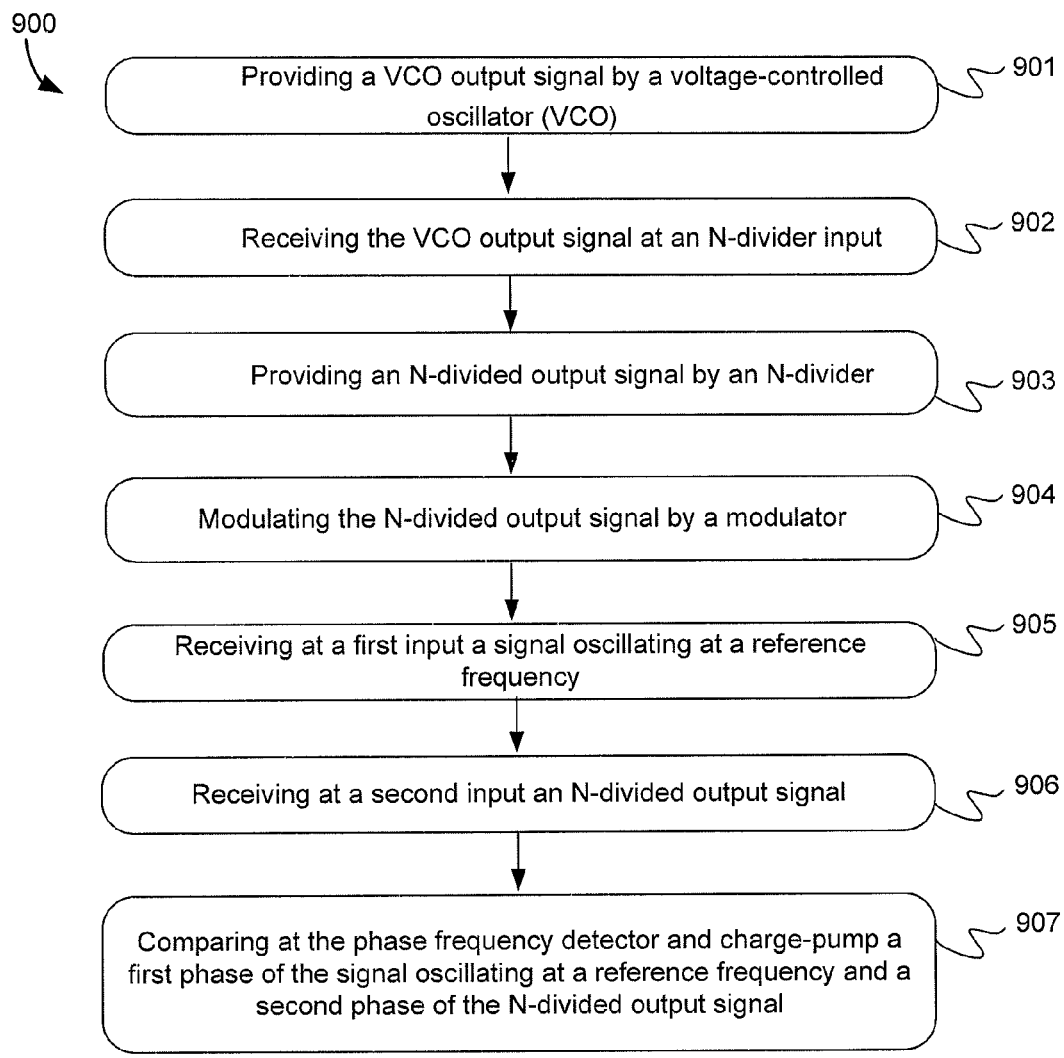
FIG. 9 illustrates exemplary method steps for a conventional phase-locked loop circuit with a fractional-N modulator.

FIG. 9 illustrates exemplary method steps 900 for a PLL circuit with a fractional-N modulator. The PLL method steps 900 are for providing a VCO output signal by a voltage-controlled oscillator (VCO) 901, receiving the VCO output signal at an N-divider 902, providing an N-divided output signal by an N-divider 903, modulating the N-divided output signal by a modulator 904, receiving at a first input a signal oscillating at a reference frequency 905, receiving at a second input an N-divided output signal 906, and comparing at the phase frequency detector and charge-pump a first phase of the signal oscillating at a reference frequency and a second phase of the N-divided output signal 907.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

I claim:

1. A phase frequency detector circuit, applied to a fractional-N synthesizer phase-locked loop (PLL) circuit comprising:
a charge-pump,
a voltage-controlled oscillator (VCO) for providing a VCO output signal,
an N-divider having an input for receiving the VCO output signal and for providing an N-divided output signal,
a modulator for modulating the N-divided output signal, a reference frequency supply, and
a loop filter,
the phase frequency detector circuit comprising:
a first input for receiving a signal oscillating at a reference frequency,
a second input for receiving the N-divided output signal,
an Up signal output, and
a Down signal output,
wherein the Up signal output rises when the second input rises and falls when the second input falls, the Down signal output rises when the second input rises and falls when the first input rises, and the Down signal output does not rise and does not fall when the first input falls.

2. The phase frequency detector circuit of claim 1, applied to the PLL circuit with the VCO having a positive coefficient between a control voltage for the VCO and the frequency of the VCO output signal, wherein the Up signal output drives an Up source of the charge-pump, and the Down signal output drives a Down source of the charge-pump.

3. The phase frequency detector circuit of claim 1, applied to the PLL circuit with the VCO having a negative coefficient between a control voltage for the VCO and the frequency of the VCO output signal, wherein the Up signal output drives a Down source of the charge-pump, and the Down signal output drives an Up source of the charge-pump.

4. The phase frequency detector circuit of claim 1, applied to the PLL circuit having two or more modes among which the PLL circuit varies with time, wherein the Up signal output and the Down signal output are changeable, and wherein the PLL is near or within a locked-up state.

5. The phase frequency detector circuit of claim 1, further comprising:
   a first flip-flop for receiving the N-divided output signal at a first flip-flop trigger input, the first flip-flop comprising a reset input and a first flip-flop output,
   a second flip-flop for receiving the signal oscillating at a reference frequency at a second flip-flop trigger input, the second flip-flop comprising a reset input and a second flip-flop output,
   a NAND logic gate for receiving the first flip-flop output and the second flip-flop output,
   an AND logic gate for receiving the first flip-flop output and an output of the NAND logic gate,
   an inverter logic gate for receiving the output of the NAND logic gate, an output of the inverter logic gate being connected to the reset input of the first flip-flop and the reset input of the second flip-flop,
   wherein the second input for receiving the N-divided output signal comprises the Up signal output of the phase frequency detector, and output of the AND logic gate comprises the Down signal output of the phase frequency detector.

6. The phase frequency detector circuit of claim 1, comprising:
   a first flip-flop for receiving the N-divided output signal at a first flip-flop trigger input, the first flip-flop comprising a reset input and a first flip-flop output,
   a second flip-flop for receiving the signal oscillating at a reference frequency at a second flip-flop trigger input, the second flip-flop comprising a reset input and a second flip-flop output,
   a NAND logic gate for receiving the first flip-flop output and the second flip-flop output,
   a first AND logic gate for receiving the second flip-flop output and a mode-change signal,
   a second AND logic gate for receiving the first flip-flop output and an output of the NAND logic gate,
   an inverter logic gate for receiving the output of the NAND logic gate, an output of the inverter logic gate being connected to the reset input of the first flip-flop and the reset input of the second flip-flop, and
   an OR logic gate for receiving an output of the first AND logic gate and the N-divided output signal,
   wherein output of the OR logic gate comprises an Up signal output of the phase frequency detector, and output of the second AND logic gate comprises a Down signal output of the phase frequency detector.

7. A method implemented using a phase-locked loop circuit, comprising the steps of:
   providing a VCO output signal by a voltage-controlled oscillator (VCO);
   receiving the VCO output signal by an N-divider, the N-divider providing an N-divided output signal;
   modulating the N-divided output signal;
   receiving a signal at a first input, the signal oscillating at a reference frequency;
   receiving the N-divided output signal at a second input; and
   comparing a phase of the first input and a phase of the second input at a phase frequency detector and charge-pump, with phase frequency detector functionality in which an Up signal rises when the second input rises, the Up signal falls when the second input falls, a Down signal rises when the second input rises, the Down signal falls when the first input rises, and the Down signal output does not rise and does not fall when the first input falls.

8. The method of claim 7, implemented using the phase-locked loop circuit being associated with two or more modes, the method comprising the step of:
   providing a changeable Up signal and Down signal along with time, wherein the PLL is near or within the locked-up state.

9. A method comprising the steps of:
   receiving at a first input a signal oscillating at a reference frequency;
   receiving at a second input an N-divided output signal;
   receiving at a first flip-flop the N-divided output signal at a first flip-flop trigger input, the first flip-flop comprising a reset input and a first flip-flop output;
   receiving at a second flip-flop the signal oscillating at a reference frequency at a second flip-flop trigger input, the second flip-flop comprising a reset input and a second flip-flop output;
   receiving at a NAND logic gate the first flip-flop output and the second flip-flop output;
   receiving at an AND logic gate the first flip-flop output and an output of the NAND logic gate;
   receiving at an inverter logic gate the output of the NAND logic gate, an output of the inverter logic gate being connected to the reset input of the first flip-flop and the reset input of the second flip-flop,
   wherein the second input for receiving the N-divided output signal comprises an Up signal output of the phase frequency detector, and output of the AND logic gate comprises a Down signal output of the phase frequency detector.

10. A method comprising the steps of:
    receiving at a first input a signal oscillating at a reference frequency;
    receiving at a second input an N-divided output signal;
    receiving at a first flip-flop the N-divided output signal at a first flip-flop trigger input, the first flip-flop including a reset input and a first flip-flop output;
    receiving at a second flip-flop the signal oscillating at a reference frequency at a second flip-flop trigger input, the second flip-flop including a reset input and a second flip-flop output;
    receiving at a NAND logic gate the first flip-flop output and the second flip-flop output;
    receiving at a first AND logic gate the second flip-flop output and a mode-change signal;
    receiving at a second AND logic gate the first flip-flop output and an output of the NAND logic gate;
    receiving at an inverter logic gate the output of the NAND logic gate, an output of the inverter logic gate being connected to the reset input of the first flip-flop and the reset input of the second flip-flop; and
    receiving at an OR logic gate an output of the first AND logic gate and the N-divided output signal, wherein output of the OR logic gate comprises an Up signal output of the phase frequency detector, and output of the second AND logic gate comprises a Down signal output of the phase frequency detector.

* * * * *